(12) United States Patent
Gettemy et al.

(10) Patent No.: US 8,294,482 B2
(45) Date of Patent: Oct. 23, 2012

(54) SYSTEMS AND METHODS FOR TESTING A PERIPHERAL INTERFACING WITH A PROCESSOR ACCORDING TO A HIGH-SPEED SERIAL INTERFACE PROTOCOL

(75) Inventors: Shawn Gettemy, San Jose, CA (US); Wei Yao, Fremont, CA (US); Ahmad Al-Dahle, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 244 days.

(21) Appl. No.: 12/283,949

(22) Filed: Sep. 16, 2008

(65) Prior Publication Data

US 2009/0235120 A1    Sep. 17, 2009

Related U.S. Application Data

(60) Provisional application No. 61/069,398, filed on Mar. 14, 2008.

(51) Int. Cl.
    *G01R 31/26*    (2006.01)
(52) U.S. Cl. .................. 324/760.02; 324/500; 324/76.11
(58) Field of Classification Search ............... 324/158.1, 324/770, 537; 345/87–104, 204, 690
    See application file for complete search history.

(56) References Cited

U.S. PATENT DOCUMENTS

| | | | |
|---|---|---|---|
| 7,671,628 B2* | 3/2010 | Alameh et al. | 326/63 |
| 7,728,605 B2* | 6/2010 | Gervais | 324/539 |
| 7,818,641 B2* | 10/2010 | Whetsel | 714/727 |
| 2002/0149575 A1* | 10/2002 | Moon | 345/204 |
| 2003/0158640 A1* | 8/2003 | Pillar et al. | 701/33 |
| 2004/0092135 A1* | 5/2004 | Hofmeister et al. | 439/39 |
| 2005/0025449 A1* | 2/2005 | Dirkson et al. | 385/147 |
| 2010/0077211 A1* | 3/2010 | Lee | 713/168 |

OTHER PUBLICATIONS

K. Boyce, "An Introduction to the Mobile Industry Processor Interface (MIPI) Alliance Standard[;] Serial Low-Power Inter-Chip Media Bus (SLIMbus™)," National Semiconductor Audio Products Group, URL https://www.national.com/appinfo/audio/files/intro_to_SLIMbus.pdf, 20 pages, accessed on Oct. 2, 2008.

"SLIMbus™ Host Controller IP," Arasan Chip Systems, Inc., Version 1.4, 2008, URL http://www.arasan.com/products/prod_overview/mipi/SLIMbus-Host-pb.pdf, 2 pages, accessed on Oct. 2, 2008.

* cited by examiner

*Primary Examiner* — Melissa Koval
*Assistant Examiner* — Trung Q Nguyen
(74) *Attorney, Agent, or Firm* — Gazdzinski & Associates, PC

(57) ABSTRACT

Systems and methods for testing a peripheral in accordance with a high-speed serial interface protocol are provided. A test system can test a peripheral by providing user-specified control over a test processor (which is substantially the same processor the peripheral will interface with when installed) to test, calibrate, or both test and calibrate the peripheral. The test processor can communicate with the peripheral according to the high-speed serial interface protocol, thereby effectively providing an actual "in-device" environment for testing and/or calibrating the peripheral.

13 Claims, 3 Drawing Sheets

SYSTEMS AND METHODS FOR TESTING A PERIPHERAL INTERFACING WITH A PROCESSOR ACCORDING TO A HIGH-SPEED SERIAL INTERFACE PROTOCOL

This application claims the benefit of U.S. provisional patent application 61/069,398, filed Mar. 14, 2008, which is hereby incorporated by reference herein in its entirety.

BACKGROUND OF THE INVENTION

This invention relates to testing systems, and in particular to testing systems that test peripherals that interface with a processor using a particular communications protocol.

Processors or systems-on-a-chip (SOC) are ubiquitous in electronic devices and often serve as the central hub of data exchange between the processor and peripherals such as memory, cameras, displays, or communications devices. The SOC may include several ports or buses for interfacing with the peripherals. This enables more efficient integration of peripherals, resulting in electronic devices such as laptops, phones, PDAs (personal digital assistants), personal media players, etc., that offer more features and power savings than before.

Such integration may require that the peripherals be tested, tuned, or calibrated in order to provide an electronic device that meets minimum performance criteria. Peripherals may need to be tested and/or calibrated because each peripheral may be unique and thus may have slightly different operating characteristics. For example, liquid crystal displays (LCDs) of the same make and model can be unique and differ from one another. Thus, merely interfacing any LCD with the SOC of an electronic device and operating each LCD according to the same fixed set of parameters may not yield desired performance.

Testing and/or calibrating peripherals after they have been installed into the electronic device are not practical, and in many situations are not possible. This may be due to the closed nature of the integrated SOC/peripheral solution and the specific communications protocols used to conduct communications between the SOC and the peripheral. One protocol, known as a mobile industry processor interface (MIPI) advantageously enables a processor to substantially directly communicate with a peripheral, thereby further enabling tighter system integration, but also making it more difficult or practically impossible to test and/or calibrate the peripheral after it is installed in the device.

Accordingly, what is needed is a test system to test a peripheral in accordance with a MIPI protocol.

SUMMARY

Systems and methods for testing a peripheral in accordance with a MIPI protocol are provided. A test system can test a peripheral by providing user-specified control over a test processor (which is substantially the same processor the peripheral will interface with when installed) to test, calibrate, or both test and calibrate the peripheral. The test processor can communicate with the peripheral according to the MIPI protocol, thereby effectively providing an actual "in-device" environment for testing and/or calibrating the peripheral.

In one embodiment, a test system can include a test computer and a testing module. The testing module may serve as an interface between a peripheral (e.g., an LCD subassembly or camera) and the test computer and includes a test processor. The test processor may be the same make and model as the processor the peripheral will interface with when it is installed into an end product (e.g., an electronic device). A difference with the test processor is that it is "opened up" and permits the test computer to run tests or calibration events on the peripheral through the processor, which uses the MIPI protocol to communicate with the peripheral.

In another embodiment, the test system may be used to test and adjust various settings of an LCD attached to the testing module. For example, the test system may adjust the flicker and gamma parameters of the LCD to obtain optimal LCD performance. After those parameters are determined, the test system may program an LCD driver with those determined parameters, for example, by writing those parameters to memory in the LCD driver.

In yet another embodiment, an electronic device is provided that includes a peripheral (e.g., LCD) that was tested and calibrated by a MIPI test system.

BRIEF DESCRIPTION OF THE DRAWINGS

The above and other aspects and advantages of the invention will become more apparent upon consideration of the following detailed description, taken in conjunction with the accompanying drawings, in which like reference characters refer to like parts throughout, and in which.

DETAILED DESCRIPTION

Figure 1:
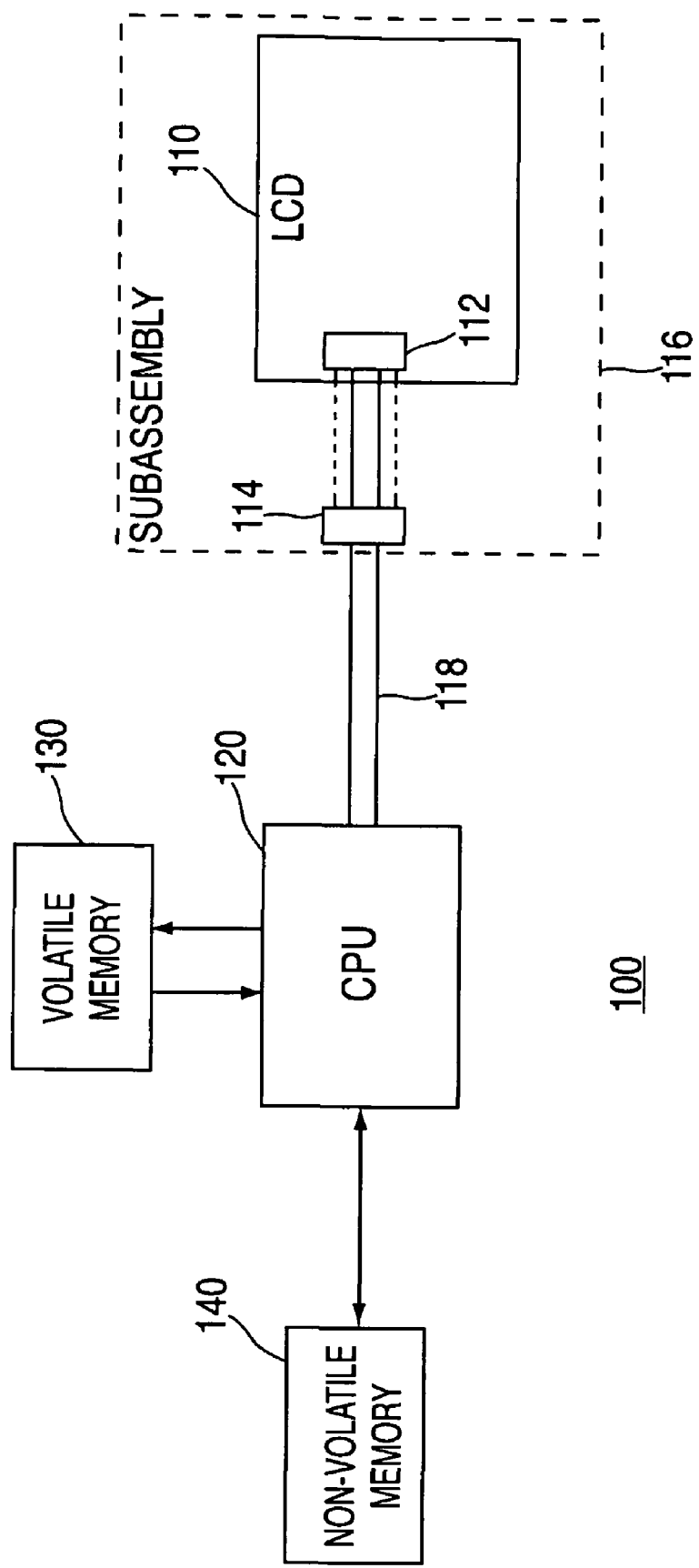
FIG. 1 is an illustrative block diagram of an end-use system including a peripheral that was tested and calibrated by a testing platform in accordance with an embodiment of the invention.

FIG. 1 is an illustrative block diagram of a system 100 including an LCD 110 that was tested and calibrated by a testing platform (e.g., as shown in a later FIG.) in accordance with an embodiment of the invention. As shown, LCD 110 may have LCD driver 112 mounted thereon. LCD driver 112 may be connected to connector 114 via a flex (connection outlined by the dotted lines between elements 112 and 114). The combination of LCD 110, driver 112, and connector 114 may be a subassembly (denoted by dashed box 116) that is tested by a testing platform according to the invention prior to assembly of system 100.

Connector 114 may be electrically coupled to processor 120 via communications paths 118. Communications paths 118 may be any suitable path for transmitting data signals. For example, communications paths 118 may be a wired link or a fiber optic link.

Processor or CPU 120 may transmit and/or receive data according to a particular protocol. In one embodiment, the protocol may be a MIPI protocol, which is a differential-ended, high-speed, serial interface (HSSI) used to interface processor 120 and LCD 110. Structurally, MIPI uses a pair of wires for each lane being used to transmit data. For example, in one embodiment, a clock lane and at least one data lane may be used to transmit information to LCD 110. The data may be transmitted in packets. For example, a packet may include header information and data. The header information may specify if the data is control information (which may be used to control, for example, workflow) or image information (which may be used to generate red/green/blue values for pixels in the display). Advantages of using MIPI include reduced number of wires, faster charge/discharge of parasitic capacitance, reduced voltage swing, reduced number of pins, and increased signal integrity. To achieve optimal performance, various portions of the peripheral interfacing with the processor using MIPI (e.g., LCD driver 112) may require customization. These customized parts may require custom programming, which is provided using a testing system in accordance with embodiments of this invention.

As also shown in FIG. 1, system 100 can include volatile memory 130 (e.g., ram or DDR) and non-volatile memory 140 (e.g., flash or a hard-disk). Processor 120 can communicate with memories 130 and 140 to obtain data as needed and provide it, for example, to a peripheral. For example, when system 100 displays content on LCD 110, processor 120 may obtain content from non-volatile memory 140, buffer a frame of content in volatile memory 130, and provide the buffered content to LCD 110 over path 118, according to the MIPI protocol, for display.

Using the MIPI protocol, processor 120 can substantially directly communicate with LCD driver 112. That is, there is no need for bridge circuitry, which is used in connection with MPL (i.e., single-ended HSSI) protocol systems, to be disposed between processor 120 and connector 114. (MPL is the acronym for the Mobile Pixel Link communications protocol.) The MIPI protocol offers substantial advantages over its MPL counterpart in terms of performance and system integration. In terms of integration, processor 120 can process data retrieved from memory 130 or 140 according to the MIPI protocol and provide it to LCD 110. Thus, because processor 120 is processing data according to the MIPI protocol, peripherals (such as LCD 110) interfacing with processor 120 may need to be tested and/or calibrated to ensure optimal operation. For example, it may be necessary to test whether a peripheral is properly receiving or processing data according to the MIPI protocol. In another example, a test may need to be run to determine if the peripheral is operating according to predetermined criteria.

Figure 2:
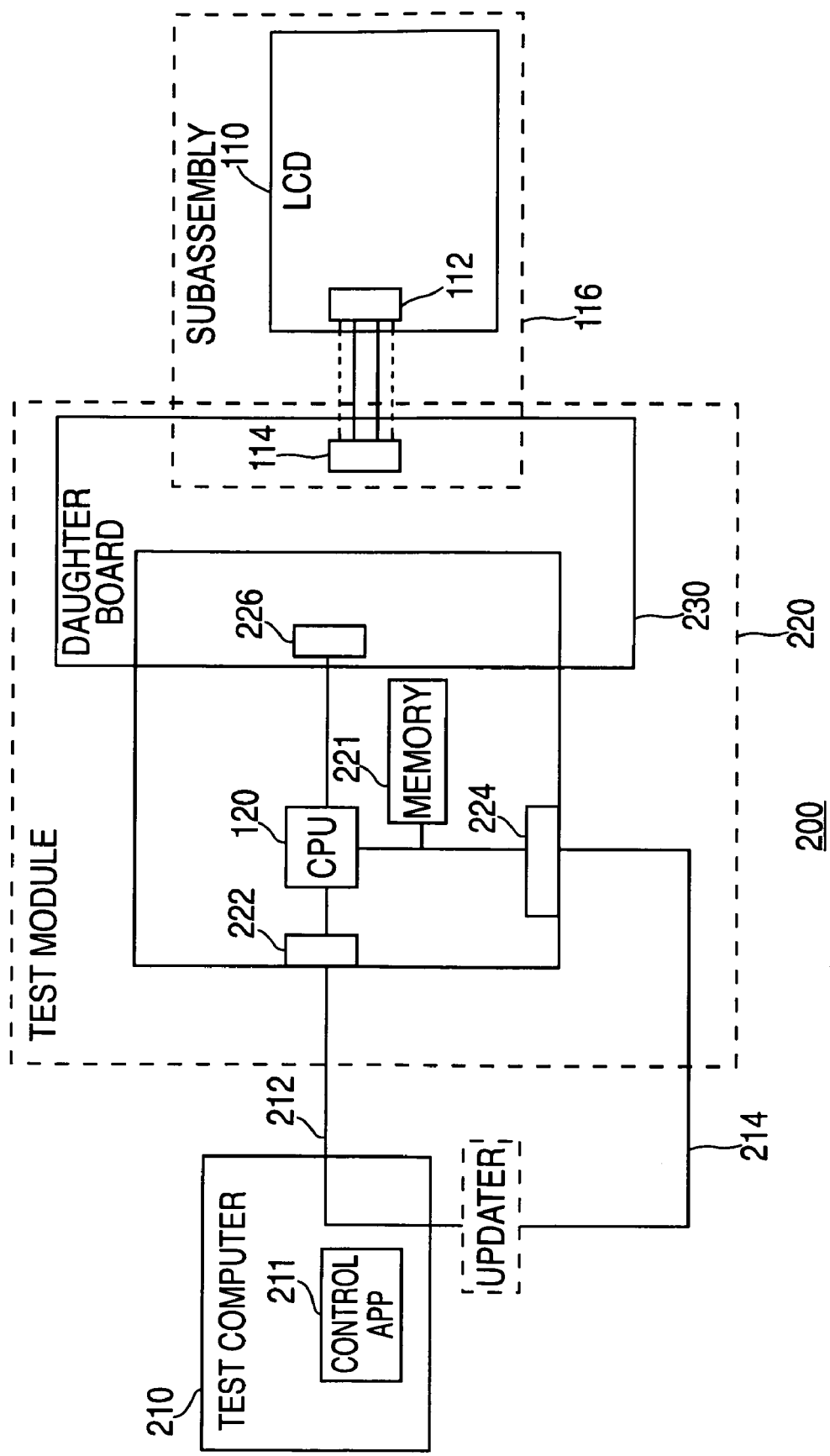
FIG. 2 shows an illustrative test system according to an embodiment of the invention.

FIG. 2 shows an illustrative test system 200 according to an embodiment of the invention. Test system 200 can include test computer 210, test module 220, and LCD subassembly 116. Module 220 can include test processor 120, dock 222, dock 224, interface 226, and daughter-board 230. Test processor 120 may be another instance of the same processor as that shown in FIG. 1. Using the same processor (i.e., processor 120) in test system 200 that is used in end-use system 100 advantageously promotes testing and calibration of LCD subassembly 116. (The phrase "end-use" just refers to the final hook-ups or connections to peripheral 116 per se.) It will be understood that the term "same processor" refers to the same make and model processor, both instances of which may be operating according to the same firmware instruction set (stored, e.g., in memory 221). If it is desired to update the firmware or other software of test system 200, test computer 210 may provide such updates via dock 224.

Test computer 210 may be electrically coupled to test processor 120 via path 212 and dock 222. Through path 212, test computer 210 may control processor 120 to test a peripheral (shown as LCD subassembly 116) attached to module 220. Commands and data provided by test computer 210 may be processed by processor 120 and provided to interface 226, which routes the commands and data through daughter-board 230 to connector 114. After test computer 210 finishes testing and/or calibrating subassembly 116, subassembly 116 may be removed and a new one put in its place.

Test computer 210 may include software (e.g., a control application) 211 to control test module 220 and test a peripheral (shown as LCD subassembly 116) attached to test module 220. The software 211 may test any number of parameters related to the peripheral 116 or the system (e.g., processor). For example, in an embodiment where the peripheral is an LCD subassembly, the test computer 210 may test display 110 for flicker and gamma performance, test the system for serial interface link performance, and test the system for optical performance. In addition, test computer 210 may be able to adjust various parameters affiliated with the peripheral. In the LCD subassembly 116 embodiment, adjustments may be made for flicker and gamma values. The adjustments may be made at the direction of a user who manually directs the adjustments though test computer 210, or adjustments may be performed automatically by test computer 210. Automatic adjustments may be performed, for example, by having a camera (not shown) monitor the LCD screen and feed back data (e.g., flicker and gamma values) to test computer 210, which uses that data to make adjustments as necessary.

Test computer 210 may also be able to program peripherals attached to module 220. For example, after test computer 210 determines the appropriate flicker and gamma values for subassembly 116, test computer 210 may program an eeprom (not shown separately) located in LCD driver 112 so that it operates according to the flicker and gamma values determined to work best for this particular subassembly 116.

One of the advantages of test system 200 is that it permits test computer 210 to directly access and control MIPI protocol commands in processor 120.

Figure 3:
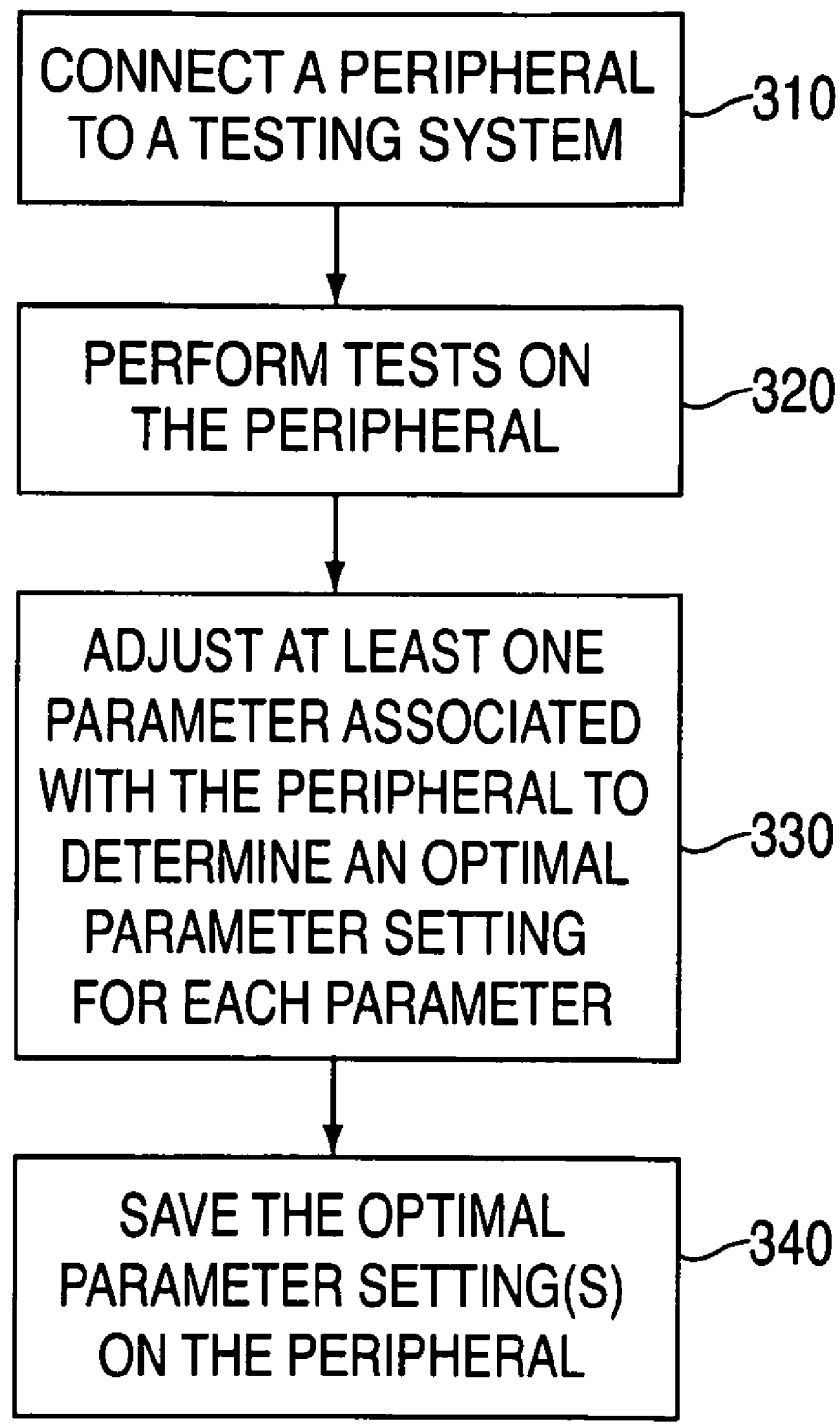
FIG. 3 is a flow chart of illustrative steps that may be performed by a test system in accordance with an embodiment of the invention.

FIG. 3 is a flow chart of illustrative steps that may be performed by a test system (e.g., as in FIG. 2) in accordance with an embodiment of the invention. Starting at step 310, a peripheral (e.g., an LCD subassembly 116) is connected to a testing system (e.g., daughter-board 230 of FIG. 2). At step 320, tests may be performed on the peripheral using a test processor (e.g., 120) processing data and commands supplied by a test computer (e.g., 120). If desired, tests may be performed to evaluate the communications link (e.g., 112, 114, etc.) between the test processor (e.g., 120) and the peripheral (e.g., 116).

At step 330, at least one parameter associated with the peripheral (e.g., 116) is adjusted to determine an optimal parameter setting for such parameter(s). It will be understood that steps 320 and 330 may be performed in conjunction with each other. The parameter adjustments may be performed by the test processor (e.g., 120) under the direction of the test computer (e.g., 210). After all adjustable parameters have been found, the optimal parameter settings(s) may be saved on the peripheral (e.g., 116), as indicated by step 340. The test processor (e.g., 120) may save the settings in on-board memory mounted to the peripheral (e.g., 116).

It will be appreciated that these steps are merely illustrative, and that additional steps may be included or existing steps may be omitted. For example, a step may be added to account for manual input of parameter adjustments by a test system user.

The foregoing describes systems and methods for testing peripherals that interface with a processor using a MIPI protocol. Those skilled in the art will appreciate that the invention can be practiced by other than the described embodiments, which are presented for the purpose of illustration rather than of limitation, and the invention is limited only by the claims which follow.

What is claimed is:

1. A system for testing a peripheral, comprising:
   a test computer; and
   a test module comprising:

a test processor electrically coupled to a test computer interface and a peripheral interface, the test processor operative to communicate with the peripheral according to a high-speed serial interface protocol, and the test processor responsive to commands provided by the test computer; wherein the test module further comprises:
a dock electrically coupled to the test processor; and
memory for storing firmware, the memory electrically coupled to the test processor.

2. The system of claim 1, wherein the test computer comprises a control application operative to perform at least one test on the peripheral using the test processor.

3. The system of claim 1, wherein the test computer comprises a control application operative to adjust at least one parameter of the peripheral using the test processor.

4. The system of claim 3, wherein the control application is operative to store at least one parameter on a memory of the peripheral.

5. The system of claim 1, wherein the test processor is the same make and model of a processor the peripheral will interface with when installed in an end-use electronic device.

6. A method for testing a peripheral, the method implemented in a system comprising a test processor operative to communicate with the peripheral according to a high-speed serial interface protocol and controlled by a test computer, the method comprising:
controlling the test processor, which communicates with the peripheral according to the MIhigh-speed serial interface protocol, the controlling comprising:
testing the peripheral;
adjusting at least one parameter of the peripheral; and
saving at least one adjusted parameter setting on a memory of the peripheral.

7. The method of claim 6, further comprising using the test computer to control the test processor.

8. The method of claim 7, wherein the peripheral is a camera.

9. The method of claim 6, wherein the peripheral is a liquid crystal display (LCD).

10. The method of claim 9, wherein the at least one parameter of the LCD is a flicker parameter.

11. The method of claim 9, wherein the at least one parameter of the LCD is a gamma parameter.

12. The method of claim 9, wherein the at least one adjusted parameter setting is saved on a memory of the LCD.

13. An electronic device comprising:
a display; and
a processor operative to communicate with the display according to a high-speed serial interface protocol, wherein the display was calibrated with a test system using a test processor of the same make and model of the processor used in the electronic device in order to (1) adjust at least one parameter of the display, and (2) save at least one adjusted parameter setting in a memory of the display, and wherein the test processor communicated with the display according to the high-speed serial interface protocol.

* * * * *